United States Patent
Abramovici et al.

(10) Patent No.: US 6,442,732 B1
(45) Date of Patent: Aug. 27, 2002

(54) VIRTUAL LOGIC SYSTEM FOR SOLVING SATISFIABILITY PROBLEMS USING RECONFIGURABLE HARDWARE

(75) Inventors: Miron Abramovici, Berkeley Heights; Jose T. De Sousa, Sterling, both of NJ (US)

(73) Assignee: Lucent Technologies, Inc., Murray Hill, NJ (US)

(*) Notice: Subject to any disclaimer, the term of this patent is extended or adjusted under 35 U.S.C. 154(b) by 0 days.

(21) Appl. No.: 09/295,534

(22) Filed: Apr. 21, 1999

(51) Int. Cl.$^7$ ................................................ G06F 17/50
(52) U.S. Cl. ............................................ 716/4; 716/16
(58) Field of Search ................... 716/1, 2, 4, 6, 716/7, 16, 17, 18; 326/37, 39, 41, 38; 703/13, 14, 15

(56) References Cited

U.S. PATENT DOCUMENTS

| | | | |
|---|---|---|---|
| 4,541,071 A | | 9/1985 | Ohmori |
| 5,452,231 A | * | 9/1995 | Butts et al. .................. 716/16 |
| 5,574,388 A | * | 11/1996 | Barbier et al. ................ 326/41 |
| 5,604,888 A | * | 2/1997 | Kiani-Shabestari et al. ... 703/23 |
| 5,644,515 A | * | 7/1997 | Sample et al. ................ 703/23 |
| 5,831,996 A | | 11/1998 | Abramovici et al. |
| 5,903,744 A | * | 5/1999 | Tseng et al. .................. 716/16 |
| 6,009,256 A | * | 12/1999 | Tseng et al. .................. 703/13 |
| 6,292,916 B1 | | 9/2001 | Abramovici et al. ........ 714/736 |

FOREIGN PATENT DOCUMENTS

| | | |
|---|---|---|
| EP | 0 759 662 A2 | 2/1997 |
| GB | 2 286 737 A | 8/1995 |
| GB | 2 304 438 A | 3/1997 |

OTHER PUBLICATIONS

J.H. Mayer, "Reconfigurable computing redefiines design flexibility," Computer Design, pp. 49–52, Feb. 1997.
J. Rosenberg, "Implementing Cache Logic™ with FPGAs," Atmel Application Note 0461A, pp. 7–11 to 7–14, 1994.
B.K. Fawcett, "Applications of Reconfigurable Logic," in "More FPGAs," W.R. Moore and W. Luk, eds., Abingdon EE & CS Books, Oxford, England, pp. 57–69, 1994.
H. Schmit, "Incremental Reconfiguration for Pipelined Applications," IEEE Symposium on FPGAs for Custom Computing Machines, pp. 47–55, 1996.
"Atmel FPGA is as Versatile as Madison Square Garden," ASIC Design, p. A21, Dec. 1994.
M. Disman, "FPGAs go on the record," OEM Magazine, pp. 85, 87, Nov. 1996.
K. Kwiat and W. Debany, "Reconfigurable Logic Modeling," Design Automation, http://www.isdmag.com/Editorial/1996/CoverStory9612.html, 5 pages, Dec. 1996.

(List continued on next page.)

Primary Examiner—Matthew Smith
Assistant Examiner—Paul Dinh
(74) Attorney, Agent, or Firm—Ryan, Mason & Lewis, LLP

(57) ABSTRACT

A virtual logic system for solving satisfiability problems on reconfigurable hardware, such that the reconfigurable hardware can be used to solve problems much larger than its available capacity. In an illustrative embodiment, a set of reconfigurable hardware including a number of field programmable gate arrays (FPGAs) is configured to solve a satisfiability problem. The satisfiability problem is decomposed into a number of independent and disjoint subproblems, e.g., using a simple decomposition in conjunction with disjoint partitioning, such that each of the subproblems is implementable within a given one of the FPGAs without the need for any inter-FPGA communication. Each FPGA then independently determines a satisfiability indication for one of the subproblems. At least a subset of the FPGAs may each be used to process more than one of the subproblems.

26 Claims, 4 Drawing Sheets

OTHER PUBLICATIONS

M.J. Wirthlin and B.L. Hutchings, "A Dynamic Instruction Set Computer," Proceedings of the IEEE Symposium on FPGAs for Custom Computing Machines, Apr. 19–21, 1995, Napa Valley, CA, pp. 99–107, Apr. 1995.

P. Zhong et al., "Accelerating Boolean Satisfiability with Configurable Hardware," Proc. IEEE Symp. on Field–Programmable Custom Computing Machines, 11 pages, Apr. 1998.

P. Zhong et al., "Using Reconfigurable Computing Techniques to Accelerate Problems in the CAD Domain: A Case Study with Boolean Satisfiability," Proc. Design Automation Conf., 6 pages, Jun. 1998.

A. Rashid et al., "Dynamic Circuit Generation for Solving Specific Problem Instances of Boolean Satisfiability," Proc. IEEE Symp. on Field–Programmable Custom Computing Machines, pp. 196–203, Apr. 1998.

H. Fujiwara et al., "On the Acceleration of Test Generation Algorithms," IEEE Trans. on Computers, vol. C–32, No. 12, pp. 1137–1144, Dec. 1983.

M. Platzner et al., "Acceleration of Satisfiablity Algorithms by Reconfigurable Hardware," Proc. Intn'l. Workshop on Field–Programmable Logic and Applications, pp. 69–78, Sep. 1998.

M. Abramovici et al., "Satisfiability on Reconfigurable Hardware," Proc. Intn'l. Workshop on Field–Programmable Logic and Applications, pp. 448–456, Sep. 1997.

P. Zhong et al., "Solving Boolean Satisfiability with Dynamic Hardware Configurations," Proc. Intn'l. Workshop on Field–Programmable Logic and Applications, pp. 326–335, 1998.

T.J. Park et al., "Partitioning Methods for Satisfiability Testing on Large Formulas," Proc. 13th Intn'l. Conf. on Automated Deduction, 7 pages, 1996.

* cited by examiner-

FIG. 1

Simplify (Var=val) {
To_imply (Var=val)
for every assignment Var=val to be implied {
   if value of Var is $\overline{val}$ then return "UNSAT"
   if value of Var is val then continue
   assign Var=val
   for every clause cls satisfied by Var=val
     for every literal lit of cls Remove_literal (lit)
     Remove_clause (cls)
   for every literal lit of Var Remove_literal (lit)
   Remove_variable (Var)
   for every variable Var who lost literals {
     if Var has no literals then Remove_variable (Var)
     if Var has only non-inverting literals then
       To_imply (Var=1)
     if Var has only inverting literals then
       To_imply (Var=0) }
   for every clause cls who lost literals {
     if no literals left then return "UNSAT"
     if cls has only one literal lit of variable Var then
       if lit is inverting then To_imply (Var=0)
       else To_imply (Var=1) }
 } // no more assignments to imply
if no clauses left then return "SAT"
return "SIMPLIFIED"
}

FIG. 2

```
Select_best_var () {
RESTART: for every variable Var to be analyzed {
    lowest_penalty = 0
    status = Simplify (Var = 0)
    if (status = "SAT") then return "SAT"
    if (status = "UNSAT") then { // Var must be 1
        Restore()
        status = Simplify (Var = 1)
        if (status = "SAT") then return "SAT"
        if (status = "UNSAT") then return "UNSAT"
        go to RESTART }
    penalty = number of unassigned common variables
    Restore()
    if (penalty < lowest_penalty) then {
        lowest_penalty = penalty
        best_var = Var}
    status = Simplify (Var = 1)
    if (status = "SAT") then return "SAT"
    if (status = "UNSAT") then { // Var must be 0
        Restore()
        status = Simplify (Var = 0)
        if (status = "SAT") then return "SAT"
        if (status = "UNSAT") then return "UNSAT"
        go to RESTART }
    penalty = number of unassigned common variables
    Restore()
    if (penalty ≥ lowest_penalty) then continue
    lowest_penalty = penalty
    best_var = Var
    } // all variables analyzed
return "DONE"
}
```

FIG. 3

Decompose_to Partition (formula) {
if (Size() ≤ MAX_SIZE) then { // it fits
   ++*nparts*
   return "DONE" }
*Bipartition (first_subformula, 2nd_subformula)*
if (*Common_vars* = ∅) then { // disjoint subformulas
   *status1* = *Decompose_to_Partition (first_subformula)*
   if (*status1* = "UNSAT") then return "UNSAT"
   *status2* = *Decompose_to_Partition (2nd_subformula)*
   if (*status2* = "UNSAT") then return "UNSAT"
   if (*status1* = "SAT" and *status2* = "SAT") then
     return "SAT"
   return "DONE" }
// we have common variables
*status* = *Select_best_var*()
if (*status* ≠ "DONE") then return *status*
*Simplify (best_var=0)*
*status0* = *Decompose_to_Partition (formula)*
if (*status0* = "SAT") then return "SAT"
*Restore*()
*Simplify (best_var=1)*
*status1* = *Decompose_to_Partition (formula)*
if (*status1* = "SAT") then return "SAT"
if (*status0* = "UNSAT" and *status1* = "UNSAT") then
    return "UNSAT"
return "DONE"
}

*FIG. 4*
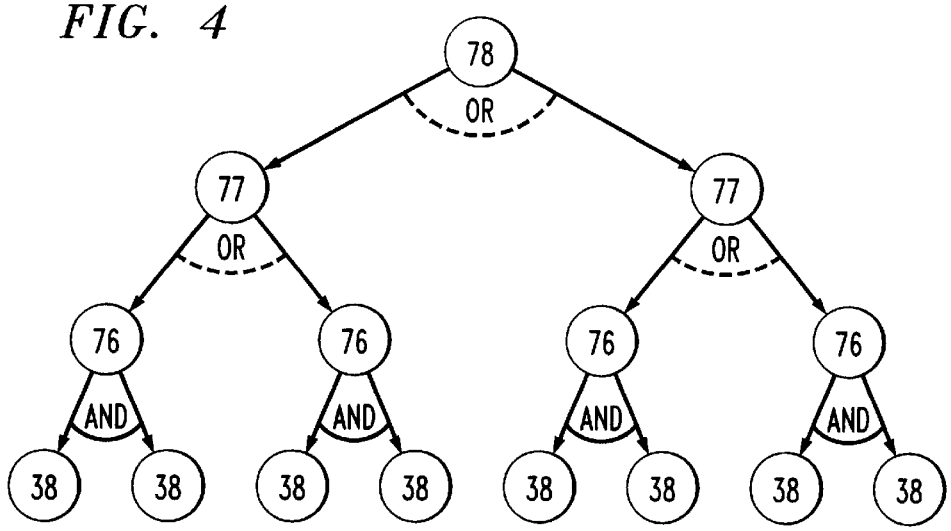
*FIG. 5*
| A | B | OR | AND |
|---|---|---|---|
| SAT | SAT | min(a,b) | max(a,b) |
| SAT | UNSAT | a | b |
| UNSAT | SAT | b | a |
| UNSAT | UNSAT | max(a,b) | min(a,b) |
*FIG. 6*
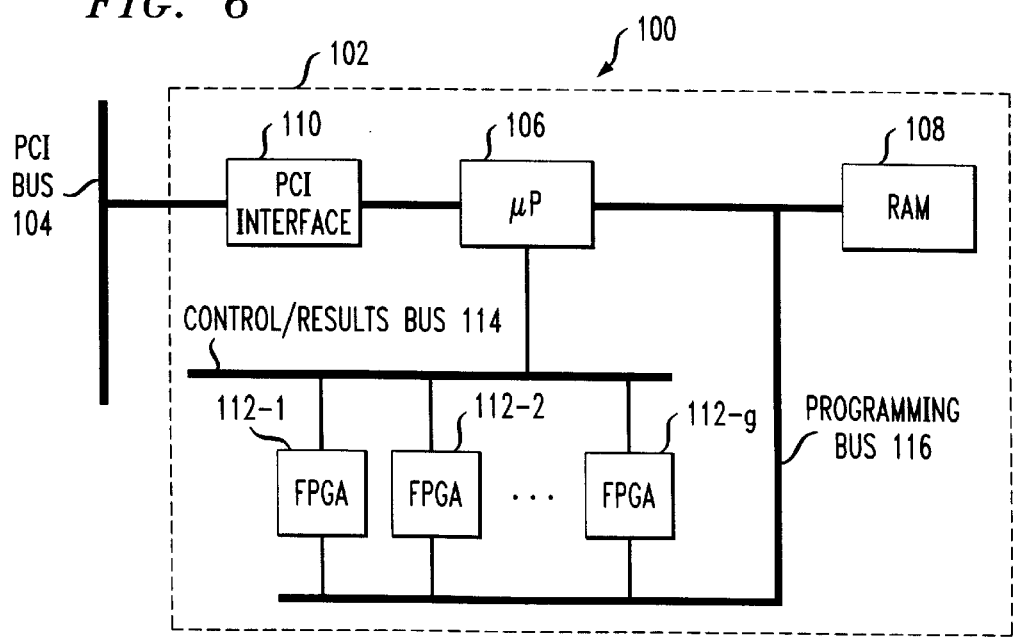

VIRTUAL LOGIC SYSTEM FOR SOLVING SATISFIABILITY PROBLEMS USING RECONFIGURABLE HARDWARE

FIELD OF THE INVENTION

The present invention relates generally to computational aspects of the design and testing of integrated circuits and other complex devices and systems, and more particularly to techniques for implementing so-called satisfiability algorithms involving such devices and systems.

BACKGROUND OF THE INVENTION

Satisfiability (SAT) is a computationally-difficult problem which is central to many computer-aided design (CAD) and test applications. The SAT problem may be characterized as follows: given a boolean function $F(x_1, x_2, \ldots x_n)$, find an assignment of binary values to the variables $x_1, x_2, \ldots x_n$, such that F is set to 1, or prove that no such assignment exists. Typically, F is expressed as a product-of-sums, which is also called conjunctive normal form (CNF). An example of a formula F in CNF is as follows:

$$F=(A+\bar{B})\cdot(\bar{A}+B)\cdot(A+\bar{B}).$$

In this example, the formula F includes two variables (A and B) and three clauses, each with two literals. The literals in the third clause are $A+\bar{B}$, where $\bar{B}$ is an inverting literal and A is a non-inverting literal. The assignment (A=1, B=1) is a so-called "satisfying assignment," i.e., it sets all the clauses and F to 1. Hence, the formula F given above is satisfiable. An example of an unsatisfiable formula F' is given by:

$$F'=F\cdot(\bar{A}+\bar{B})$$

In applications involving combinational circuits, the above-noted variables $x_j$ may represent primary inputs (PIs) of a given circuit, while F represents the primary output (PO) of that circuit. CAD and test applications that can be characterized as a SAT problem include, for example, timing verification, routing and routability analysis, fault diagnosis, logic synthesis and logic verification. SAT is also related to automatic test pattern generation (ATPG) algorithms, as it can be viewed as the problem of generating a test for a stuck-at-0 fault on a PO. An important component in ATPG is the so-called line justification problem, which deals with setting an internal signal to a given value, and corresponds to SAT on a subcircuit. Many other computationally-difficult problems, such as graph coloring, scheduling, theorem proving and constraint satisfaction problems, have also been mapped to SAT problems.

A significant drawback often associated with SAT problems is the amount of computation time required for their solution. Even with the most advanced SAT algorithms, difficult problems, such as those involving complex very-large-scale integration (VLSI) circuits, can require many hours of computation using powerful computers. A number of recently-developed techniques have attempted to simplify the SAT computation process through the use of reconfigurable hardware. Reconfigurable hardware is used in adaptive computing and other applications to implement logic circuit functions. A given set of reconfigurable hardware, which may be based on field programmable gate arrays (FPGAs) or other similar programmable logic devices, can be reconfigured so as to provide different logic functions at different times, thereby in effect providing the functionality of a complex circuit which would otherwise require substantially more hardware. Reconfigurable hardware platforms designed to facilitate SAT computation are referred to as "satisfiers."

Another drawback associated with solving SAT problems using the above-noted reconfigurable hardware is the capacity and the cost of the reconfigurable hardware platform. Existing satisfiers are generally limited in the size of the problems they can handle by their available hardware capacity. As a result, any problem that does not fit within the available capacity of a given satisfier is automatically classified as "out-of-bounds" for that satisfier. Although conventional logic emulators can have a large capacity (up to several million gates), they are generally quite expensive (about $0.50 per emulated gate) and hence not easily affordable. However, most other hardware platforms that are reasonably priced do not provide sufficient capacity. A need therefore exists for improved techniques for solving satisfiability problems on reconfigurable hardware.

SUMMARY OF THE INVENTION

The invention provides a virtual logic system for solving satisfiability problems on reconfigurable hardware, which allows the reconfigurable hardware to solve problems much larger than its available capacity. In an illustrative embodiment, a set of reconfigurable hardware including a number of field programmable gate arrays (FPGAs) is configured to solve a satisfiability problem. The satisfiability problem is decomposed into a number of independent and disjoint subproblems, e.g., using a simple decomposition in conjunction with disjoint partitioning, such that each of the subproblems is implementable within a given one of the FPGAs without the need for any inter-FPGA communication. Each FPGA then independently determines a satisfiability indication for one of the subproblems. At least a subset of the FPGAs may each be used to process more than one of the subproblems.

In accordance with one aspect of the invention, a simple decomposition technique is provided for decomposing the satisfiability problem into a number of independent subproblems such that each of the subproblems is solvable by a single hardware element, e.g., a single FPGA, of a reconfigurable hardware platform. In one possible implementation, the simple decomposition technique utilizes a formula splitting process that is repeated recursively for k variables. If this decomposition process is represented by a binary OR tree with k levels, the subproblems to be solved are obtained at the terminal nodes of the tree. The OR relation between the two branches of a node means that solving one of the two subproblems is sufficient to solve the original problem. The more variables assigned, the smaller the subproblems become, although k should be limited since the number of subproblems is $2^k$. The resulting subproblems share all the variables that are not assigned, so the subproblems are not disjoint. Nevertheless, the subproblems are independent since the values of the shared variables do not have to be correlated, as different subproblems may obtain different satisfying vectors for the original problem.

In accordance with another aspect of the invention, a disjoint partitioning decomposition technique is provided which utilizes the above-noted simple decomposition technique in conjunction with disjoint partitioning to decompose a satisfiability problem into a number of independent and disjoint subproblems. One possible implementation of this disjoint partitioning decomposition utilizes a clause bipartitioning algorithm, which starts by creating a one-component cluster from each clause of a satisfiability formula in conjunctive normal form (CNF), and then repeatedly merges clusters based on a measure reflecting the number of common variables, until two final clause clusters are obtained such that their number of common variables is minimized. To separate these two clusters, at least some of their common variables are assigned. The algorithm tries tentative formula simplifications for both 0 and 1 assignments to each common variable, and evaluates the simplifications based on the reduction obtained in the set of common variables. If there are no common variables, the process continues recursively with the two disjoint sub formulas, both of which need to be satisfied. The recursion terminates when the current sub formulas fit into a target reconfigurable hardware platform. The disjoint partitioning decomposition technique generally results in a significantly smaller number of subproblems than the previously-described simple decomposition technique.

The decomposition techniques of the invention can effectively divide a satisfiability formula into independent subproblems that can be concurrently run by, e.g., multiple FPGAs, without the need for inter-FPGA signals or conventional multi-FPGA partitioning. In addition, the decomposition techniques of the invention are independent of the reconfigurable hardware platform, so they may be used with any satisfier.

Advantageously, the invention allows a reconfigurable hardware platform to process circuits much larger than the available capacity of the platform at the cost of a limited amount of additional processing time. For example, the invention allows any satisfier implemented with reconfigurable hardware, e.g., multiple FPGAs, to process circuits much larger than the available capacity of the FPGAs. Since the invention does not require any inter-FPGA signal routing, it can be implemented using a platform that is much simpler and cheaper than a conventional logic emulator. An additional benefit provided by the invention is a significant speed-up in computation time, e.g., up to three orders of magnitude, obtained by the concurrent solving of subproblems. Moreover, by avoiding the delays associated with inter-FPGA signal routing, a virtual logic system in accordance with the invention can operate at a substantially higher clock frequency than would otherwise be possible. Another advantage is that the virtual logic system of the invention is easily scalable to accommodate satisfiability problems of any size, e.g., larger problems can be handled simply by using additional or larger FPGAs.

BRIEF DESCRIPTION OF THE DRAWINGS

FIGS. 1, 2 and 3 show sets of pseudocode for implementing formula simplification, variable selection, and decomposition for partitioning, respectively, in accordance with the invention;

FIG. 4 shows an example of an OR/AND decomposition tree which may be generated in accordance with the invention using the pseudocode of FIGS. 1, 2 and 3;

FIG. 5 illustrates execution times for a pair of subproblems in an embodiment of the invention; and FIG. 6 shows an illustrative embodiment of a virtual logic system in accordance with the invention.

DETAILED DESCRIPTION OF THE INVENTION

The following description will illustrate the present invention using an exemplary system which includes a set of reconfigurable hardware and is suitable for processing complex logic circuits. It should be understood, however, that the invention is not limited to use with any particular type of system. For example, the described techniques are readily applicable to reconfigurable hardware applications based on various arrangements of single or multiple FPGAs, as well as to reconfigurable hardware which does not include FPGAs. The term "reconfigurable hardware" as used herein is intended to include any type of system or device capable of implementing a number of different circuit functions, including, for example, single or multiple FPGA devices, personal computers, microcontrollers, as well as portions or combinations of these and other systems and devices. Reconfigurable hardware suitable for use in conjunction with the invention may be implemented in many different ways, including, for example, in the form of a co-processor circuit board attached to a host system over a bus, as a stand-alone system, or as any other suitable processing device capable of providing the described functions.

The present invention provides improved techniques for decomposition of SAT problems. An illustrative embodiment utilizes a simple SAT decomposition technique, in which a splitting process continues until each of a number of different subproblems fits within a single FPGA, in conjunction with a disjoint partitioning technique which creates subproblems with disjoint sets of variables. As will be described in greater detail below, the combined technique of the invention significantly reduces the number of subproblems, thus providing the basis for an improved virtual logic system.

Simple SAT Decomposition

In M. Bohm and E. Speckenmeyer, "A Fast Parallel SAT Solver: Efficient Workload Balancing," Annals of Mathematics and Artificial Intelligence, Vol. 17, No. 3–4, pp. 381–400, 1996, an original SAT problem is decomposed into n subproblems, which are then distributed to n conventional processors, and inter-processor communications are used for load balancing. The principle underlying this simple SAT decomposition is well-known: split the problem $F(x_1, x_2, \ldots x_n)=1$ into first and second subproblems obtained by setting one variable to 0 and 1, respectively. Splitting on variable $x_1$ in this manner yields the two subproblems $F(0, x_2, \ldots x_n)=1$ and $F(1, x_2, \ldots x_n)=1$. Clearly, any solution to the first (second) subproblem is also a solution to the original problem if $x_1=0$ (1). Therefore, to conclude that the original problem is unsatisfiable, every subproblem must be proven unsatisfiable. The CNF for a subproblem is a subset of the original CNF. Thus any subproblem is smaller than the original problem.

The above-described splitting process can be repeated recursively for k variables. If this decomposition process is represented by a binary OR tree with k levels, the subproblems to be solved are obtained at the terminal nodes of the tree. The OR relation between the two branches of a node means that solving one of the two subproblems is sufficient to solve the original problem. The more variables assigned, the smaller the subproblems become. Of course, k should be limited since the number of subproblems is $2^k$. The subproblems share all the variables not assigned, so they are not disjoint. Nevertheless, they are independent since the values of the shared variables do not have to be correlated, as different subproblems may obtain different satisfying vectors for the original problem.

In accordance with the invention, the assigning of variables in the splitting process continues until each subproblem fits into one FPGA, i.e., can be independently implemented within a single FPGA. Unlike circuit partitioning into multiple FPGAs, this decomposition does not require inter-FPGA signals. The advantages of not having any inter-FPGA signals are very significant. First, conventional multi-FPGA partitioning is no longer needed, and hence the design flow becomes simpler and faster. Second, the large delays associated with signals propagating off-chip, onto a satisfier board, and back on-chip are avoided, which allows a faster clock speed. Third, the above-noted decomposition can use a reconfigurable hardware platform that is much simpler, smaller, and cheaper than a conventional logic emulator, in which inter-FPGA communication is generally a complex problem requiring expensive solutions, such as hierarchical crossbar structures, dedicated field-programmable interconnect chips, or time-multiplexing hardware. Unlike multi-FPGA partitioning techniques which have to deal with a specific board interconnect scheme, the above-described decomposition is independent of the architecture of the target hardware platform.

The above-described simple SAT decomposition, which eliminates the need for inter-FPGA signals, can be used to implement a virtual logic system in accordance with the invention. For example, if a given problem has a number n of subproblems which is greater than a number g of available FPGAs, one or more of the g FPGAs can be dynamically reconfigured for different subproblems. An FPGA that has finished a subproblem may be immediately reconfigured for the next one. The reconfiguration time is in most cases negligible compared with the computation time. In the worst case where all n subproblems must be solved, every FPGA will process, on the average, n/g problems. Thus the worst-case loss of efficiency caused by the time-multiplexing of FPGAs is proportional to n/g, which also represents the overflow ratio between the size of the problem and the available hardware capacity.

Note that, in the extreme, this simple SAT decomposition technique works even with a single FPGA, which must be reconfigured at most n times. For example, assume that a large SAT problem is decomposed into 1,000 subproblems so that each one fits into one FPGA, but the reconfigurable hardware platform is limited to 50 FPGAs. So the problem size is significantly larger, i.e., 20 times larger, than the available capacity. Nevertheless, the problem can still be solved by simply reconfiguring every FPGA for at most 20 subproblems. Since the computation can stop as soon as one FPGA finds a solution, it is likely that only an unsatisfiable original problem will require all 20 runs to complete.

Another benefit of the above-described simple SAT decomposition of the present invention is the additional speed-up obtained by the g FPGAs working concurrently on different subproblems. Since each subproblem is simpler than the original and is restricted to a smaller search space, and also because all computations can stop as soon as one solution is found, the average speed-up is usually greater than g.

A drawback of this simple SAT decomposition technique is that in some CNFs the reductions in the problem size are relatively small, such that too many variables need to be assigned in order to make every subproblem fit into one FPGA, which in turn results in too many subproblems. This occurs in CNFs characterized by a small ratio between literals and variables, because setting one variable in such a formula results in a small reduction in the size of the problem. Another aspect of the present invention, decomposition for disjoint partitioning, provides a more general solution applicable to any CNF, and will be described in detail below.

Decomposition for Disjoint Partitioning

One type of partitioning used in software SAT solvers, e.g., as described in J. M. Silva, "An Overview of Backtrack Search Satisfiability Algorithms," Proc. 5th Int'l. Symp. on Artificial Intelligence and Mathematics, January 1998, is finding subsets of clauses that depend on disjoint subsets of variables. The resulting subproblems are independent and may be separately solved. If one subproblem is unsatisfiable, then so is the original problem. The solution to the original problem is obtained by concatenating the individual solutions of all subproblems. A disjoint partition provides an exponential reduction of the worst-case search space of a SAT solver, but it is seldom found in practical problems. However, such partitions may be created dynamically, as a consequence of the formula simplifications caused by assignments to variables.

As previously noted, the simple decomposition technique described above is inefficient when variable assignments result only in small reductions in the size of subproblems. The present invention solves this problem by providing a new decomposition technique, whose goal is to assign variables so that the resulting subproblems are disjoint. The new decomposition technique thus makes use of the fact that disjoint partitioning significantly reduces the size of the resulting subproblems.

FIG. 1 shows a pseudocode example of an illustrative simplification procedure Simplify in accordance with the invention. The process of simplifying a formula based on an assignment Var=val involves removing those parts of the formula (variables, literals, and clauses) that become inactive, i.e., "dead," as a result of implying Var=val. The operator $To_{13}$ imply schedules assignments to be processed. If val conflicts with the current value of Var, the formula is recognized as unsatisfiable. All clauses satisfied by setting Var=val are removed from the formula, along with all of their literals. All remaining literals of Var and the variable itself are also removed.

After this set of simplifications, all variables that lost one or more literals are analyzed. A variable for which all of its literals have died is also removed. If the remaining literals of a variable are all inverting or all non-inverting, this variable, also referred to as a "dynamically unate" variable, may be safely assigned to the value that will satisfy all its clauses. Next all clauses that lost one or more literals are analyzed. These clauses are unsatisfied. If all the literals of a clause have been removed, this clause can no longer be satisfied, so the formula is recognized as unsatisfiable. If a clause is left with only one literal, its variable is assigned the value that satisfies the clause. This process is repeated until there are no more variables assigned. If at this point all clauses are satisfied, the formula is recognized as satisfied.

An illustrative decomposition procedure in accordance with the invention utilizes a clause bipartitioning algorithm, which starts by creating from each clause a one-component cluster, then repeatedly merges clusters (based on a "closeness" measure reflecting the number of common variables), until two final clause clusters are obtained such that their number of common variables is minimized. To separate these two clusters, at least some of their common variables are assigned. The algorithm tries tentative formula simplifications for both 0 and 1 assignments to each common variable, and evaluates the simplifications based on the reduction obtained in the set of common variables. If there are no common variables, the process continues recursively with the two disjoint sub formulas (both need to be satisfied). The recursion terminates when the current sub formulas fit into the target reconfigurable hardware platform.

Unlike the approach described in T. J. Park and A. Van Gelder, "Partitioning Methods for Satisfiability Testing on Large Formulas," Proc. 13th Int'l. Conf. on Automated Deduction, 1996, which generates subproblems by assigning all common variables, resulting in $2^{nc+1}$ subproblems, where nc is the number of common variables, the above-described decomposition in the illustrative embodiment of the invention assigns the variables one at a time, and computes the implications of each assignment. Since the common variables are chosen so that their assignment contributes to elimination of other common variables, in general the decomposition of the invention generates much fewer than $2^{nc+1}$ subproblems.

FIG. 2 shows a pseudocode example of an illustrative variable selection procedure Select_best_var in accordance with the invention. The Select_best_var procedure tries tentative formula simplifications for both 0 and 1 assignments to each common variable, and evaluates them based on the reduction obtained in the set of common variables. The reduction in the number of literals is used as a tie-breaker. These simplifications are tentative since the changes they introduce may be erased by the procedure Restore. The procedure also involves some learning, namely, when one assignment Var=val falsifies the formula, then Var is set to val on a permanent basis, i.e., without any subsequent Restore. The analysis is restarted after each instance of learning-induced simplification.

FIG. 3 shows a pseudocode example of an illustrative recursive decomposition procedure Decompose_to_Partition in accordance with the invention. This decomposition procedure attempts to achieve a disjoint partitioning of the formula. MAX_SIZE is the capacity of the target FPGA and Size( ) provides the size of the current formula, both expressed as a number of literals. The number of literals that can fit in the target FPGA can be estimated, e.g., after library modules are defined. The recursion terminates when the current formula fits into one FPGA. If the formula is too large, Bipartition clusters the clauses in two sub formulas as disjoint as possible, and also computes the set Common_vars.

If there are no common variables, the process continues recursively with the two disjoint sub formulas. Note that in this case both sub formulas must be satisfied in order to satisfy the original formula, so when one subformula is identified as unsatisfiable, the original formula will also be unsatisfied. When there are common variables, the best variable to assign is selected using the procedure given in FIG. 2, and then the decomposition is recursively continued with the two simplified formulas obtained by assigning the best variable. Here it is sufficient to satisfy only one of the two subproblems. Again, when one subformula is identified as unsatisfiable, the original formula will also be unsatisfied.

FIG. 4 shows an example of a decomposition tree generated for a benchmark SAT problem known as "dubois26," one of the SAT benchmarks in the DIMACS set, DIMACS Challenge Benchmarks, ftp://dimacs.rutgers.edu/pub/challenge/sat/benchmarks/cnf/, using the above-described decomposition for disjoint partitioning. The dubois26 formula has 78 variables, 208 clauses, and 624 literals. The number inside a given node of the decomposition tree in FIG. 4 is the number of variables for the corresponding subproblem. The dotted arcs in the tree denote OR decomposition, where it is sufficient to solve only one subproblem, while the heavy arcs denote AND decomposition obtained by disjoint partitioning, where both subproblems must be solved and their solutions concatenated. Setting MAX_SIZE=300 literals, and assigning 2 variables, results in 8 subproblems corresponding to the terminal nodes of the tree, each subproblem having 38 variables, 100 clauses, and 296 literals. Thus the dubois26 SAT benchmark can be solved with 8 unconnected FPGAs using the techniques of the invention. It should be noted that the FIG. 4 example is a simple example of a decomposition tree generated in accordance with the invention. In practical applications, the subproblems will generally have different sizes, and the OR/AND graph will typically not be symmetric.

An additional advantage of the decomposition for disjoint partitioning illustrated by the decomposition tree of FIG. 4 is the speed-up resulting from the 8 FPGAs working concurrently solving subproblems much simpler than the original one, i.e., only 38 variables instead 78. Moreover, the execution can be stopped as soon as the first pair of ANDed subproblems find a solution or as soon as one FPGA from each pair identifies an unsatisfiable subproblem. If there are only 2 available FPGAs, the problem can be solved in at most 4 rounds of computation.

FIG. 5 shows a table summarizing the execution time for a pair of subproblems, A and B, obtained by decomposing a common parent problem using the above-described techniques. The execution time for the subproblems A and B depends on the decomposition type (AND or OR), the results (SAT or UNSAT) for the subproblems, and the execution times (denoted by a and b, respectively) for the subproblems.

It should be noted that the above-described simple SAT decomposition and disjoint partitioning decomposition techniques may be combined in a single embodiment. Such an embodiment of the invention can implement an adaptive procedure that will dynamically switch between the two types of decomposition in order to better exploit the advantages of each. For example, the simple decomposition technique may provide better performance for problems with variables whose assignment contributes to significantly simplifying the formula without contributing toward achieving disjoint subproblems.

Hardware Implementation

FIG. 6 shows an illustrative embodiment of a virtual logic system in accordance with the invention. The virtual logic system is implemented in a satisfier 102. The satisfier 102 in this embodiment is in the form of a peripheral component interconnect (PCI) board which may be installed in, e.g., an otherwise conventional personal computer, workstation or other type of digital data processor 100 which includes a PCI bus 104. The satisfier 102 includes a microprocessor 106, a random access memory (RAM) 108 for storing configurations, and a PCI interface 110 for interfacing the satisfier 102 with the PCI bus 104. The satisfier 102 also includes a set of g FPGAs, 112-1, 112-2, . . . 112-g. The FPGAs are coupled to the microprocessor 106 via a control/results bus 114, and to the microprocessor 106 and RAM 108 via a shared programming bus 116.

The microprocessor 106 controls the virtual logic system of the satisfier 102, based on an OR/AND decomposition tree having terminal nodes which specify a number of subproblems for a given problem to be solved. The OR/AND decomposition tree is generated in the manner described in conjunction with FIGS. 1 through 4 above. The microprocessor 106 assigns subproblems to available FPGAs, starts their reconfiguration process, initiates the FPGA operation, and monitors the FPGA completion signals.

Each FPGA communicates with the microprocessor 106 using four control signals: 1) Start; 2) Done; 3) Satisfied; and 4) Stop. When Done is asserted, Satisfied indicates whether the subformula assigned to that FPGA has been satisfied or identified as unsatisfiable. Stop is used to abort a computation in progress in one FPGA when the microprocessor 106 has already determined that the result of that FPGA is no longer needed in computing the overall result. The four control signals of all FPGAs are transmitted over the control/results bus 114. Each FPGA has an address used by the microprocessor 106 to select that FPGA as the destination for Start or Stop, or to recognize the source of Done and Satisfied. The control/results bus 114 is also used to retrieve satisfying vectors computed by different FPGAs. The shared programming bus 116 carries the configuration data from RAM 108 to the selected FPGA. Since the computation does not require data path connections among FPGAs, this architecture is much simpler than, e.g., a conventional emulator.

As previously noted, an important advantage of decomposition for disjoint partitioning in accordance with the invention is the speed-up, which increases dramatically with the number of disjoint subproblems. This allows a virtual logic system to reuse reconfigurable hardware to run different batches of subproblems, without losing efficiency compared to an unpartitioned formula. In fact, a gain in efficiency can be achieved. For example, the FPGAs 112 working concurrently as shown in FIG. 6 introduce a new level of course-grain parallelism, resulting in an additional speed-up of up to three orders of magnitude.

The present invention may be used in conjunction with the fine-grain massively-parallel satisfier architecture described in U.S. pat. application Ser. No. 09/209,405 filed Dec. 10, 1998 in the name of inventors Miron Abramovici, Jose T. De Sousa and Daniel Saab and entitled "Parallel Backtracing for Satisfiability on Reconfigurable Hardware," which is assigned to the assignee of the present application and incorporated by reference herein.

The above-described embodiments of the invention are intended to be illustrative only. For example, alternative embodiments may be configured which utilize different reconfigurable hardware platforms. The invention may also be implemented in part in software, e.g., in one or more software programs stored on a computer-readable medium, and in various combinations of hardware and software. These and numerous other alternative embodiments within the scope of the following claims will be apparent to those skilled in the art.

What is claimed is:

1. A method of configuring a set of reconfigurable hardware including a plurality of reconfigurable hardware elements to solve a satisfiability problem, the method comprising the steps of:
   decomposing the satisfiability problem into a plurality of subproblems, such that each of the subproblems is implementable within a given one of the reconfigurable hardware elements without inter-element communication between the given element and the other elemets; and
   determining a satisfiability indication for each of at least a subset of the subproblems, using the corresponding reconfigurable hardware elements.

2. The method of claim 1 wherein the satisfiability problem is decomposed into a plurality of disjoint subproblems using a disjoint partitioning algorithm.

3. The method of claim 1 wherein at least a subset of the reconfigurable hardware elements comprise field programmable gate arrays.

4. The method of claim 3 wherein each of the field programmable gate arrays generates a signal indicative of whether or not that array has completed processing the corresponding subproblem.

5. The method of claim 3 wherein each of the field programmable gate arrays generates a signal providing the satisfiability indicator for the corresponding subproblem.

6. The method of claim 3 wherein each of at least a subset of the field programmable gate arrays is used to process more than one of the plurality of subproblems.

7. The method of claim 1 wherein the decomposing step includes applying a simplifications procedure to the satisfiability problem, wherein the simplification procedure involves assigning values to one or more variables associated with the satisfiability problem.

8. The method of claim 7 wherein the decomposing step includes applying a variable selection procedure to the satisfiability problem, in order to determine the one or more variables which are assigned values in the simplification procedure.

9. The method of claim 1 further including the step of supplying the satisfiability indications from the reconfigurable hardware elements to a processor which utilizes the indications in solving the satisfiability problem.

10. An apparatus comprising:
    a processor; and
    a set of reconfigurable hardware elements coupled to the processor;
    wherein the processor is operative to configure the reconfigurable hardware elements to solve a satisfiability problem, wherein the satisfiability problem is decomposed into a plurality of subproblems, such that each of the subproblems is implementable within a given one of the reconfigurable hardware elements without inter-element communication between the given element and the other elements, and wherein the set of reconfigurable hardware determines a satisfiability indication for each of at least a subset of the subproblems, using the corresponding reconfigurable hardware elements.

11. The apparatus of claim 10 wherein the satisfiability problem is decomposed into a plurality of disjoint subproblems using a disjoint partitioning algorithm.

12. The apparatus of claim 10 wherein at least a subset of the reconfigurable hardware elements comprise field programmable gate arrays.

13. The apparatus of claim 12 wherein each of the field programmable gate arrays generates a signal indicative of whether or not that array has completed processing for the corresponding subproblem.

14. The apparatus of claim 12 wherein each of the field programmable gate arrays generates a signal providing the satisfiability indicator for the corresponding subproblem.

15. The apparatus of claim 12 wherein each of at least a subset of the field programmable gate arrays is used to process more than one of the plurality of subproblems.

16. The apparatus of claim 10 wherein the processor is further operative to apply a simplification procedure to the satisfiability problem, wherein the simplification procedure involves assigning values to one or more variables associated with the satisfiability problem.

17. The apparatus of claim 16 wherein the processor is further operative to apply a variable selection procedure to the satisfiability problem, in order to determine the one or more variables which are assigned values in the simplification procedure.

18. The apparatus of claim 10 wherein the processor is further operative to receive the satisfiability indications from the reconfigurable hardware elements and to utilize the indications in solving the satisfiability problem.

19. An apparatus comprising:

a plurality of reconfigurable hardware elements;

means for decomposing a satisfiability problem into a plurality of subproblems, such that each of the subproblems is implementable within a given one of the reconfigurable hardware elements without inter-element communication between the given element and the other elements; and means for determining a satisfiability indication for each of at least a subset of the subproblems, using the corresponding reconfigurable hardware elements.

20. The apparatus of claim 19 further including means for solving the satisfiability problem utilizing the satisfiability indications for the subproblems.

21. A method of configuring a set of reconfigurable hardware including a plurality of reconfigurable hardware elements to solve a satisfiability problem, wherein the satisfiability problem is decomposed into a plurality of subproblems, the method comprising the step of:

implementing a given one of the subproblems in a corresponding one of the reconfigurable hardware elements, such that a satisfiability indication can be determined for the given subproblem by the corresponding reconfigurable hardware element without inter-element communication between the corresponding reconfigurable hardware element and the other reconfigurable hardware elements.

22. The method of claim 21 further including the step of solving the satisfiability problem utilizing satisfiability indications for the subproblems.

23. An apparatus comprising:

a processor; and a set of reconfigurable hardware elements coupled to the processor;

wherein the processor is operative to configure the set of reconfigurable hardware elements to solve a satisfiability problem, wherein the satisfiability problem is decomposed into a plurality of subproblems, and wherein the processor is further operative to direct the implementation of a given one of the subproblems in a corresponding one of the reconfigurable hardware elements, such that a satisfiability indication can be determined for the given subproblem by the corresponding reconfigurable hardware element without inter-element communication between the corresponding reconfigurable hardware element and the other reconfigurable hardware elements.

24. The apparatus of claim 23 wherein the processor is further operative to receive the satisfiability indications from the reconfigurable hardware elements and to utilize the indications in solving the satisfiability problem.

25. An apparatus comprising:

a plurality of reconfigurable hardware elements; and means for implementing a given one of a plurality of subproblems of a satisfiability problem in a corresponding one of the reconfigurable hardware elements, such that a satisfiability indication can be determined for the given subproblem by the corresponding reconfigurable hardware element without inter-element communication between the corresponding reconfigurable hardware element and the other reconfigurable hardware elements.

26. The apparatus of claim 25 further including means for solving the satisfiability problem utilizing satisfiability indications for the subproblems.

* * * * *